(12) United States Patent
Aripin

(10) Patent No.: US 9,768,091 B2
(45) Date of Patent: Sep. 19, 2017

(54) METHOD OF FORMING AN ELECTRONIC PACKAGE AND STRUCTURE

(75) Inventor: Azhar Aripin, Subang Jaya (MY)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 1071 days.

(21) Appl. No.: 13/408,058

(22) Filed: Feb. 29, 2012

(65) Prior Publication Data

US 2013/0208439 A1    Aug. 15, 2013

(30) Foreign Application Priority Data

Feb. 13, 2012  (MY) .............................. PI2012000591

(51) Int. Cl.
| | |
|---|---|
| H01L 23/28 | (2006.01) |
| H01L 23/31 | (2006.01) |
| H01L 23/495 | (2006.01) |
| H01L 21/48 | (2006.01) |
| H01L 23/00 | (2006.01) |

(52) U.S. Cl.
CPC ...... *H01L 23/3107* (2013.01); *H01L 21/4821* (2013.01); *H01L 23/4951* (2013.01); *H01L 23/49541* (2013.01); *H01L 23/49548* (2013.01); *H01L 24/97* (2013.01); *H01L 24/73* (2013.01); *H01L 2224/32245* (2013.01); *H01L 2224/48247* (2013.01); *H01L 2224/73265* (2013.01); *H01L 2224/97* (2013.01); *H01L 2924/07802* (2013.01); *H01L 2924/15151* (2013.01); *H01L 2924/181* (2013.01); *Y10T 29/49117* (2015.01)

(58) Field of Classification Search
CPC .................................................... H01L 23/4951
USPC .................................. 257/666, 676; 174/534
See application file for complete search history.

(56) References Cited

U.S. PATENT DOCUMENTS

| | | | |
|---|---|---|---|
| 6,348,726 B1 | 2/2002 | Bayan et al. | |
| 6,617,197 B1 | 9/2003 | Bayan et al. | |
| 6,838,751 B2 | 1/2005 | Cheng et al. | |
| 7,375,416 B2 | 5/2008 | Retuta et al. | |
| 7,554,182 B2* | 6/2009 | Shirasaka et al. | 257/676 |
| 2001/0013639 A1* | 8/2001 | Abe | 257/666 |
| 2011/0163433 A1* | 7/2011 | Toda et al. | 257/676 |
| 2012/0181680 A1* | 7/2012 | Li | 257/676 |

\* cited by examiner

*Primary Examiner* — Hung V Ngo
(74) *Attorney, Agent, or Firm* — Kevin B. Jackson

(57) ABSTRACT

In one embodiment, an electronic package structure includes multiple rows of I/O pads and is formed without a flag portion. An electronic device may be attached to a pair of adjacent inner rows of I/O pads. The pair of adjacent inner rows of I/O pads is configured to support, at least in part, the electronic device, and to receive connective structures, such as wire bonds. Connective structures may electrically connect the electronic device to the multiple rows of I/O pads, and an encapsulating layer covers portions of the I/O pads, the electronic device and the connective structures.

7 Claims, 4 Drawing Sheets

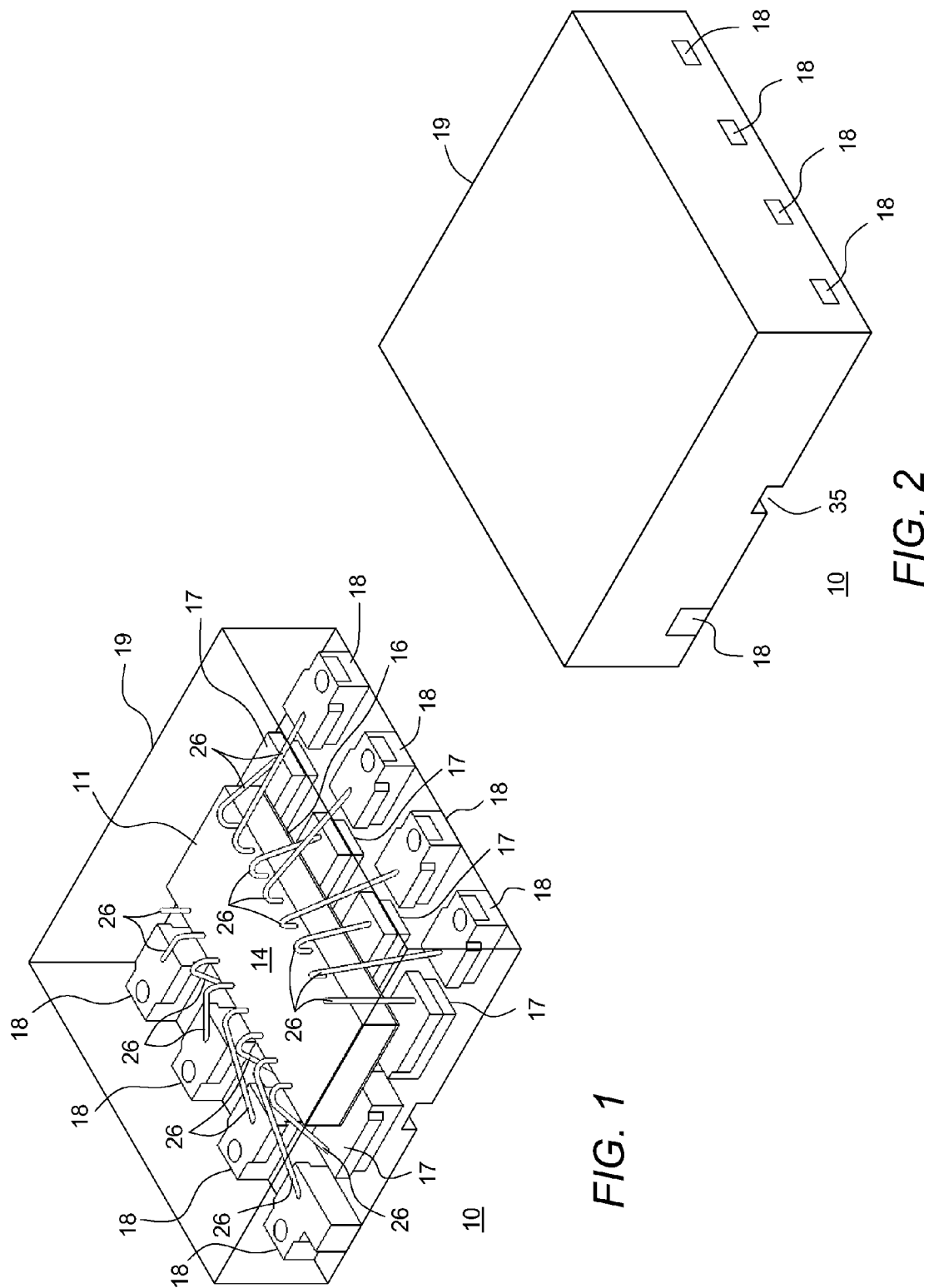

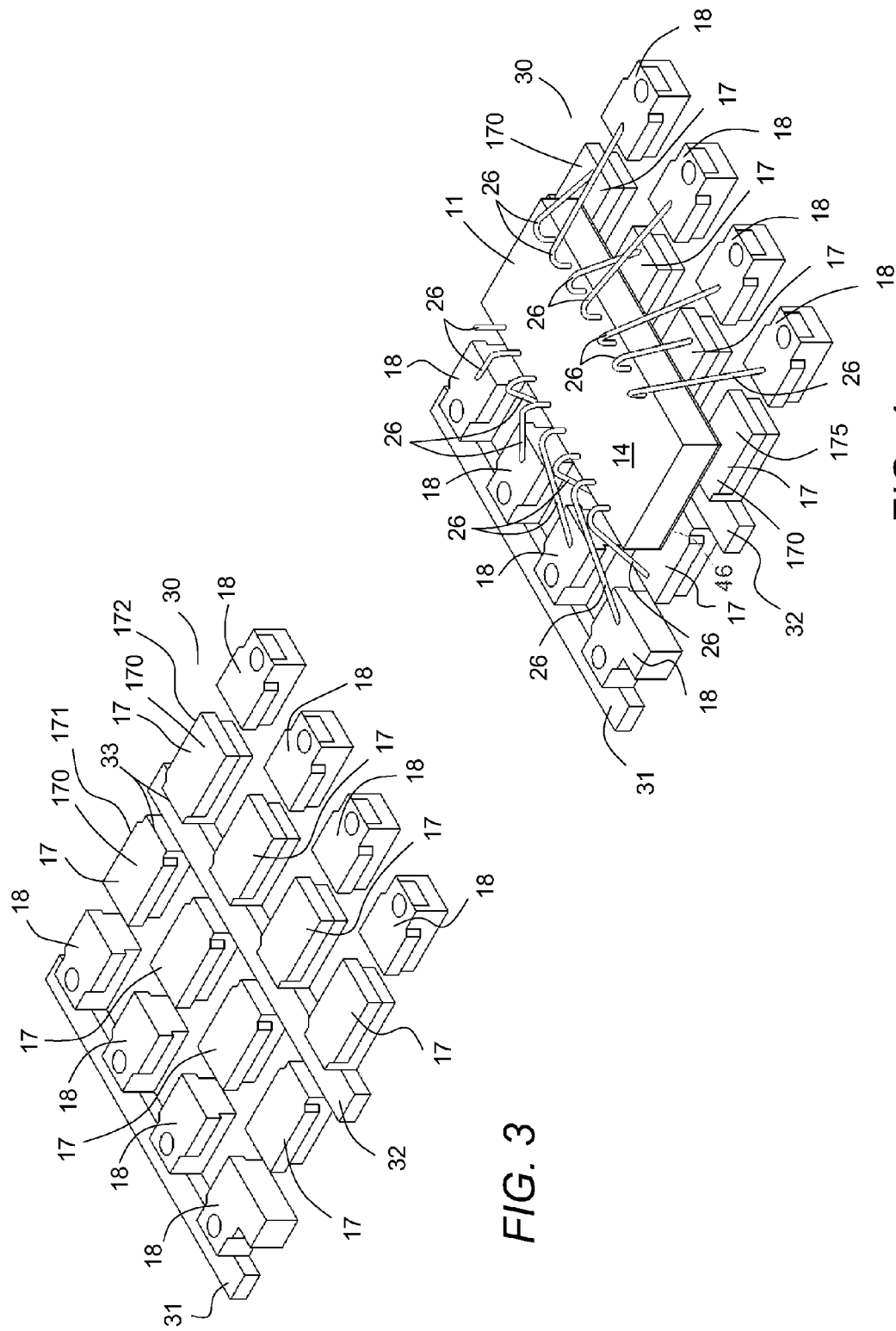

METHOD OF FORMING AN ELECTRONIC PACKAGE AND STRUCTURE

BACKGROUND

This document relates generally to electronic devices, and more specifically to methods of forming packaged electronics devices and structures.

Many electronic device applications mandate high levels of integration and functionality on the smallest possible platform. In certain applications, semiconductor devices are assembled in small outline leadless type protective packages. One common type of such protective package is the quad-flat pack no-lead type package or "QFN" package. In past QFN packages, the input/output ("I/O") pads were placed surrounding and spaced apart from a flag portion or die attach portion where the semiconductor chip was placed. Wire bonds connected the semiconductor chip to the I/O pads. The I/O pads were placed in a single row configuration around the flag portion, or they were placed in a multi-row configuration around the flag portion. The multi-row I/O configurations were desired to support higher pin-count devices.

One previous QFN package with a multi-row I/O configuration used staggered or alternating I/O pads that were held together in a leadframe with tie bars until final assembly when the I/O pads were all separated into individual pads. In another previous multi-row I/O configuration, the outer rows of I/O pads were held together using a tie bar, and the inner row of I/O pads was tied to the flag until final assembly when the I/O pads and the flag were all separated into individual and isolated structures. In both previous configurations, the assembled package consisted of a separate and distinct flag portion that held the semiconductor chip, a separate and distinct inner row of I/O pads, and a separate and distinct outer row of I/O pads.

One problem with the previous QFN multi-row I/O configurations was that the overall package size had to be increased to make room for the multiple rows of I/O pads and the structures that held them in place (for example, tie bars) until final assembly. This limited the number of I/O pads that could be used, or required that the overall package size be increased, which is undesirable.

Accordingly, structures and methods of manufacture are needed for packages with multiple rows of I/O pads that support higher I/O densities in small outline electronic packages, such as QFN type packages.

BRIEF DESCRIPTION OF THE DRAWINGS

FIG. 1 illustrates a partially transparent perspective view of an electronic structure in accordance with a first embodiment of the present invention;

FIG. 2 illustrates a perspective view of the electronic structure in accordance with the first embodiment;

FIG. 3 illustrates a perspective view of a lead frame structure in accordance with an embodiment of the present invention;

FIG. 4 illustrates a perspective view of the lead frame structure of FIG. 3 after further processing.

Figure 5:
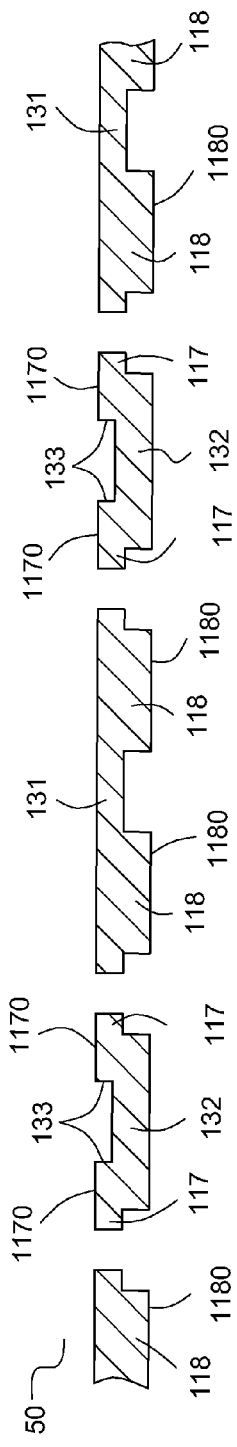
FIGS. 5-9 illustrate cross-sectional views of an electronic package structure in accordance with the present invention at various stages of fabrication.

For simplicity and clarity of illustration, elements in the figures are not necessarily drawn to scale, and the same reference numbers in different figures denote generally the same elements. Additionally, descriptions and details of well-known steps and elements may be omitted for simplicity of the description. Further, although the following Detailed Description uses a QFN style package to illustrate the present invention, this use is intended as an example only, and it is understood that the present invention applies to other package styles as well that require multiple rows of I/O pads.

DETAILED DESCRIPTION OF THE DRAWINGS

FIG. 1 shows a perspective view of a packaged electronic device or structure 10 shown in a QFN-type configuration in accordance with a first embodiment. In FIG. 1, encapsulating layer 19 (described further in conjunction with FIG. 2) is shown as transparent to illustrate the inside structure of device 10. In one embodiment, device 10 may include an electronic chip or component 11, which may be a physical component configured to affect the flow of electrons or their associated fields in a desired manner. By way of example, chip 11 may comprise a semiconductor device, such as a discrete device, an integrated circuit device, an optoelectronic device, an electromechanical sensor device, combinations thereof, or the like. In another embodiment, chip 11 may comprise, or may further comprise, a passive device or the like.

In one embodiment, chip 11 includes two opposing major surfaces 14 and 16. Device 10 further includes conductive I/O pads or structures 17 and 18 formed in a multi-row or multiple row configuration as shown, for example, in FIG. 1. I/O pads 17 and 18 may comprise, for example, metal materials, plated materials, and/or combinations thereof. In one embodiment, I/O pads 17 and 18 may comprise a copper alloy. In this embodiment, I/O pads 17 may form adjacent inner rows of I/O pads for device 10, and I/O pads 18 may form outer rows of I/O pads for device 10. In the present embodiment, major surface 16 of chip 11 may be attached to portions of I/O pads 17 so that chip 11 partially overlaps adjacent rows of I/O pads 17. In one embodiment, the size of chip 11 may be selected so that the partial overlap configuration leaves portions of I/O pads 17 exposed to accommodate interconnect structures. In accordance with the present embodiment, I/O pads 17 are configured to both to provide physical support chip 11 and to function as I/O pads. In accordance with the present embodiment, device 10 is formed without or absent a flag portion as used in prior structures. In accordance with the present embodiment, this configuration provides a smaller size for device because, among other things, the separate flag portion used in prior structures is absent while still providing the benefit of multi-row I/O configuration. In prior structures the flag portion provided physical support for the chip, but was not used for wire bond connections. In another embodiment, only some of I/O pads 17 may support chip 11.

In one embodiment, major surface 14 of chip 11 is connected to I/O pads 17 and 18 using connective structures 26, which may comprise for example, wire bonds, ribbon bonds, clips, combinations thereof, or the like. Although not shown, major surface 14 may further include conductive bond pads for connecting connective structures 26 to the various components that may be integrated within chip 11.

FIG. 2 is a perspective view of device 10 including encapsulating layer 19 shown as non-transparent. In one embodiment, encapsulating layer 19 may comprise a molded layer, which may enclose and protect portions of chip 11, connective structures 26, and I/O pads 17 and 18. In one embodiment, molded layer 19 may comprise a plastic material that may include resin, filler, pigments, reinforcements, plasticizers, and other materials. In accordance with the present embodiment, device 10 may include a gap, slot, or channel 35 in encapsulating layer 19 between adjacent I/O pads 17, which may be formed as part of the assembly process as will be explained in more detail in conjunction with FIGS. 5-9.

FIG. 3 is a perspective view of a leadframe 30 in accordance with one embodiment. It is understood that leadframe 30 may be a portion of a larger structure having multiple leadframes 30. In one embodiment, leadframe 30 may include multiple rows of I/O pads 17 and 18, with I/O pads 17 forming portions of inner rows, and I/O pads 18 forming outer rows in this embodiment. I/O pads 18 may be attached to tie bars 31 (only one is shown for ease of understanding), which are subsequently removed as will be described further in conjunction with FIGS. 5-9. In accordance with the present embodiment, lower portions of inner rows of I/O pads 17 are held together using a connective portion 32, which may be further configured to leave a gap 33 between upper portions of adjacent rows of I/O pads 17. In one embodiment, connective portion 32 may be formed as a half-etched section of leadframe 30 between adjacent rows of inner I/O pads 17. In one embodiment, connective portion 32 is half-etched in a downward direction with respect to major surfaces 170 (for example, the surface where chip 11 will be attached) of I/O pads 17. In one embodiment, connective portion 32 is configured to hold I/O pads 17 together during the assembly process, and further configured for subsequent removal to isolate I/O pads 17 from each other in the final packaged device. As shown in FIG. 3, I/O pads 171 and 172 are an example of a pair of opposing I/O pads in adjacent inner rows of I/O pads 17.

FIG. 4 shows the leadframe structure of FIG. 3 after additional processing. In a next step, chip 11 may be placed onto major surfaces 170 of inner and adjacent rows of I/O pads 17 and overlying gap 33 and spaced apart from connective portion 32. In one embodiment, chip 11 may include a conductive layer 46 formed on major surface 16, and conductive layer 46 may comprise, for example, a continuous or unpatterned metal layer or layers, such a titanium-nickel-silver, chromium-nickel-gold, or the like. In one embodiment, chip 11 may be attached to I/O pads 17 using a non-conductive layer or material. In one embodiment, chip 11 may be attached to I/O pads 17 using a non-conductive adhesive material, such as a non-conductive epoxy adhesive. In one embodiment, the adhesive material may comprise a non-conductive material that includes one or more epoxide groups (for example, a resin material or a thermoset polymer) or the like. In one embodiment, the adhesive material may comprise an Ablestick™ brand of non-conductive adhesives, which are available from Henkel of Dusseldorf, Germany. In other embodiments, chip 11 is attached to I/O pads using other intervening or intermediate bonding materials applied either to chip 11 or I/O pads 17, which may be configured to insulate chip 11 from I/O pads 17. Connective structures 26 may then be used to interconnect chip 11 to I/O pads 17 and 18 as shown in FIG. 3, where wire bonds are shown as an example. In a still further embodiment, one or more of I/O pads 17, designated, for example, as I/O pad 175 in FIG. 4, may be connected or attached to major surface 16 with a conductive layer or material to provide a means for providing an electrical bias to major surface 16 of chip 11, and other of I/O pads 17 may be connected or attached to major surface 16 with a non-conductive layer or material. In one embodiment, a conductive adhesive, such as a conductive epoxy adhesive, may be used for the conductive layer. In one embodiment, a connective structure 126 may not connected to I/O pad 175.

Turning now to FIGS. 5-9, a method for forming an electronic packaged device in accordance with one embodiment is described. FIG. 5 shows a partial cross-sectional view of a conductive leadframe 50, which may comprises a conductive material, such as copper, a copper alloy, a plated structure, or the like. In one embodiment, leadframe 50 includes multiple rows of I/O pads 117 and 118. I/O pads 117 may be configured as adjacent inner rows of I/O pads for the electronic devices to be assembled, and I/O pads 118 may be configured as outer rows of I/O pads. In accordance with the present embodiment, adjacent rows of inner I/O pads 117 are spaced apart a connective portion 132. In one embodiment, connective portions 132 may be formed as half-etched portions, which may be etched downward with respect to major surfaces 1170 of I/O pads 117. This configuration forms a gap 133 between adjacent I/O pads 117.

In one embodiment, I/O pads 118 may be held together with tie bars 131. In one embodiment, tie bars 131 may be formed as half-etched portions, which may be etched upward with respect to major surfaces 1180 of I/O pads 118. In one embodiment, connective portions 132 and tie bars 131 may be formed by half-etching leadframe 50 from opposite major surfaces. Alternatively, connective portions 132 and tie bars 131 may be formed using other techniques such as stamping, milling, combinations thereof, or the like.

Figure 6:
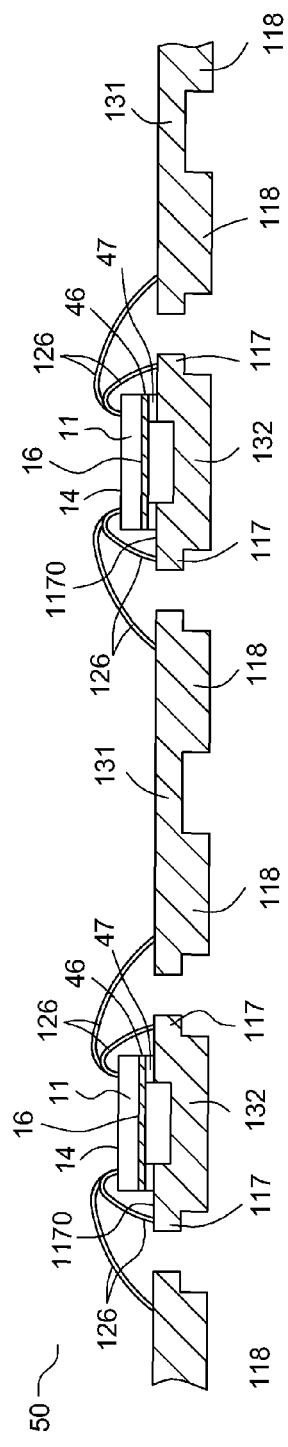

FIG. 6 shows a partial cross-sectional view of leadframe 50 after additional processing. Chips 11 having optional conductive layers 46 overlying major surfaces 16 may be attached to major surfaces 1170 of inner I/O pads 117 using an optional bonding layer 47. In one embodiment, bonding layer 47 may comprise a non-conductive adhesive material, such as a non-conductive epoxy adhesive. In another embodiment, one or more of I/O pads 117 may be attached to major surface 16 using a conductive layer, such as a conductive adhesive. As shown in FIG. 6, chips 11 overlie gaps 133, and partially overlap portions of major surfaces 1170 of adjacent inner I/O pads 117. In one embodiment, chips 11 overlie connective portions 132 without making physical contact to connective portions 132 because of gaps 133. The partial overlap leaves other portions of major surfaces 1170 exposed to receive connective structures 126, which in this embodiment may comprise wire bonds, clips, ribbon bonds, combinations thereof, or the like. In one embodiment, connective structures 126 may electrically connect bonding pads (not shown) on major surface 14 of chips 11 to I/O pads 117 and 118.

Figure 7:
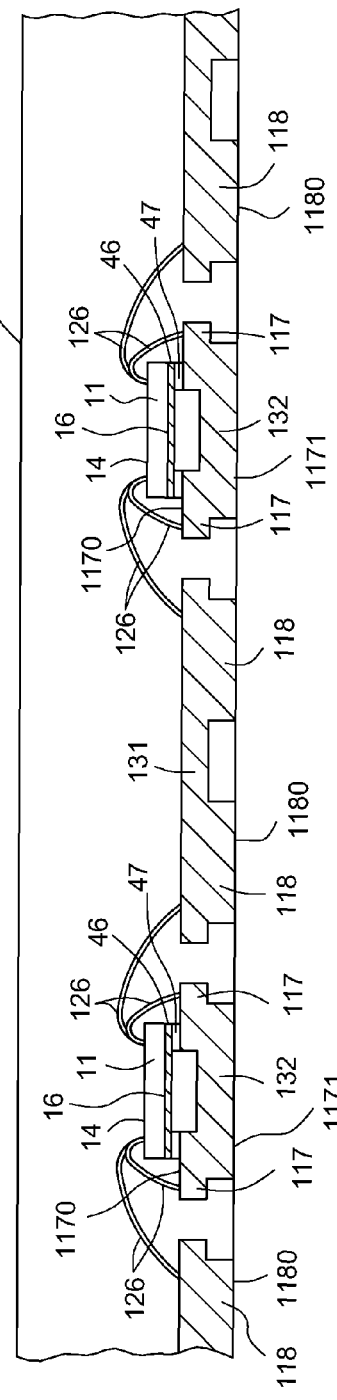

FIG. 7 shows a partial cross-sectional view of leadframe 50 after encapsulating layer 119 has been formed to cover portions of the structure while leaving major surfaces 1171 of I/O pads 117 and 1180 of I/O pads 118 exposed for connection to next levels of assembly, such as printed circuit boards. In one embodiment, encapsulating layer 119 may comprise an over-molded layer. In another embodiment, encapsulating layer 119 may comprise a cavity-molded layer. In one embodiment, molded layer 119 may comprise a plastic material that may include resin, filler, pigments, reinforcements, plasticizers, and other materials. In one embodiment, encapsulating layer 119 may fill gaps 133 during the molding process, which covers and protects exposed portions of major surfaces 16 of chips 11. Suitable molding compounds are available, for example, from suppliers such Sumitomo Bakelite Co., Ltd. of Tokyo, Japan, and Kyocera Chemical Corporation of Saitama, Japan.

Figure 8:
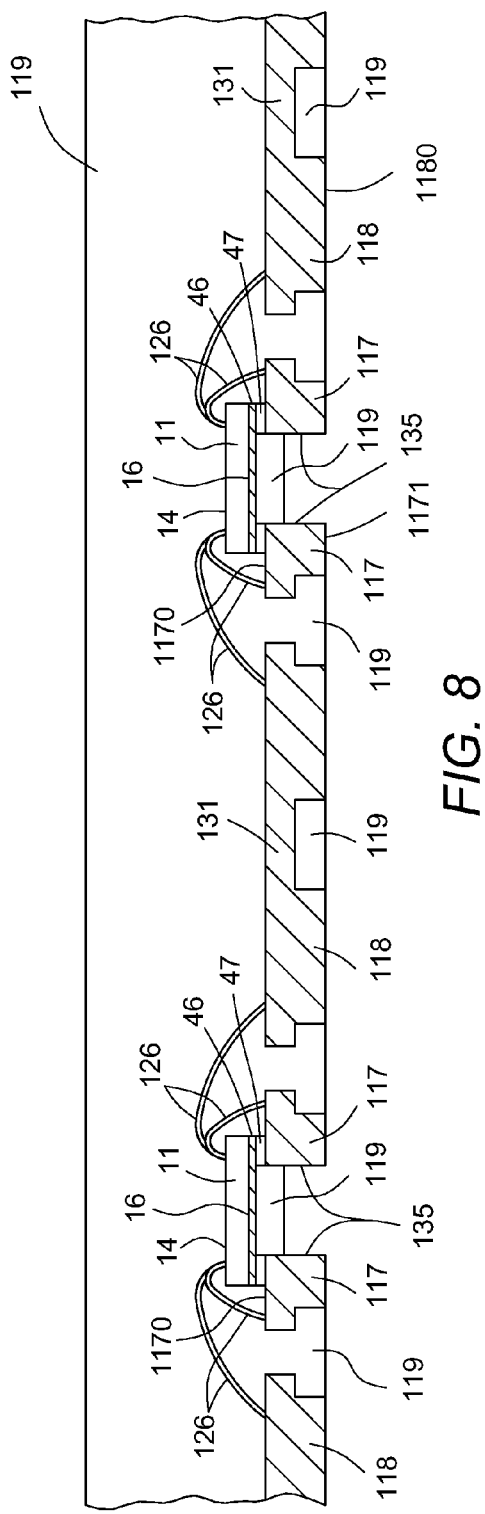
Figure 9:
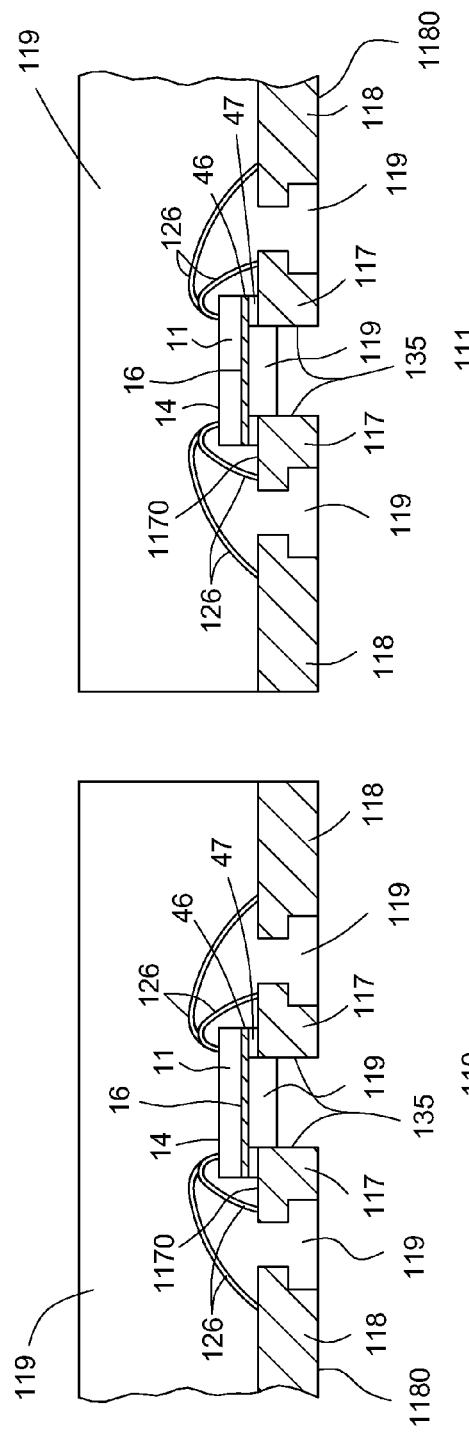

FIG. 8 is a partial cross-sectional view of leadframe structure 50 after further processing. In accordance with the present embodiment, connective portions 132 are removed to separate or isolate adjacent I/O pads 117 from each other. In one embodiment, connective portions 132 may be removed by a milling or sawing process that removes connective portions 132 while leaving portions of encapsulating layer 119 below chips 11 that filled caps 133. With connective portions 132 removed, a gap, channel, or slot 135 may remain between adjacent I/O pads 117 extending inward from major surfaces 1171. In one embodiment, chip 11 overlies slot 135. In a further step, the structure is separated through tie bars 131 to form individual electronic devices 110 and 111 as shown in FIG. 9. In one embodiment, a saw-through process may be used to remove tie bars 131 and separate the structure to form electronic devices 110 and 111.

From all of the foregoing, one skilled in the art can determine that according to one embodiment, an electronic device structure comprises a leadframe (for example, elements 30, 50) having a pair of adjacent inner rows of I/O pads (for example, elements 17, 117) and at least one outer row of I/O pads (for example elements 18, 118), wherein the leadframe is formed absent a flag portion (for example, elements 30, 50). An electronic device (for example, element 11) has first and second opposing major surfaces (for example, elements 14, 16), wherein the second major surface (for example, element 16) is attached to at least two opposing I/O pads (for example, elements 171, 172) in the pair of adjacent inner rows of I/O pads. Connective structures (for example, elements 26, 126) couple the first major surface (for example, element 14) to at least a portion of I/O pads in the pair of adjacent inner rows of I/O pads and the at least one outer row of I/O pads. An encapsulating layer (for example, elements 19, 119) covers at least portions of the leadframe, the electronic device and the connective structures.

Those skilled in the art will also appreciate that according to another embodiment, a slot (for example, elements 35, 135) is formed in the encapsulating layer formed between the at least two inner rows of I/O pads (for example, elements 17, 117).

Those skilled in the art will also appreciate that according to yet another embodiment, one I/O pad (for example, element 175) within the pair of adjacent inner rows of I/O pads is attached to the second major surface with a conductive material, and a second I/O pad (for example, element 17) within the pair of adjacent inner rows of I/O pads is attached to the second major surface with a non-conductive material.

Those skilled in the art will also appreciate that according to still another embodiment, an electronic package structure comprises a leadframe having multiple rows of I/O pads (for example, elements 17, 18, 117, 118) including a pair of adjacent inner rows of I/O pads (for example, elements 17, 117). An electronic device (for example, element 11) having first and second opposed major surfaces (for example, elements 14, 16), wherein the second major surface is coupled to the pair of adjacent inner rows of I/O pads (for example, elements 17, 117) so that portions of the second major surface overlap the pair of adjacent inner rows of I/O pads. Connective structures (for example, elements 26, 126) electrically couple the first major surface of the electronic device to the multiple rows of I/O pads. An encapsulating layer (for example, elements 19, 119) covers at least portions of the leadframe, the electronic device and the connective structures.

In one embodiment, the encapsulating layer (for example, elements 19, 119) covers the electronic device (for example, element 11), the connective structures (for example, elements 26, 126) and portions of the leadframe, while leaving other portions (for example, elements 1171, 1180) of the I/O pads (for example, elements 17, 18, 117, 118) exposed for connection to next levels of assembly.

Those skilled in the art will also appreciate that according to an additional embodiment, a slot (for example, elements 35, 135) is formed in the encapsulating layer (for example, elements 19, 119) between the pair of adjacent inner rows of I/O pads (for example, elements 17, 117), and wherein the electronic chip (for example, element 11) overlies the slot.

Those skilled in the art will also appreciate that according to a further embodiment, the structure is configured as a quad flat-pack no-lead (QFN) package (for example, elements 10, 110, 111).

Those skilled in the art will also appreciate that according to a still further embodiment, the leadframe (for example, elements 30, 50) is formed absent a flag portion.

Those skilled in the art will also appreciate that according to yet an additional embodiment, a method of forming an electronic device package comprises the steps of providing a leadframe (for example, elements 30, 50) having a plurality of I/O pads (for example, elements 17, 18, 117, 118) formed in adjacent rows, the leadframe having at least two adjacent inner rows of I/O pads (for example, elements 17, 117) held together with a connective portion (for example, element 32, 132), wherein the connective portion is formed to provide a gap (for example, elements 33, 133) between the at least two adjacent inner rows of I/O pads, and wherein the leadframe is provided absent a flag portion. The method includes attaching a first surface (for example, element 16) of an electronic device (for example, element 11) to the at least two adjacent inner rows of I/O pads, wherein the electronic device overlies the gap. The method includes attaching connective structures (for example, elements 26, 126) to a second major surface (for example, element 14) of the electronic device and to the plurality of I/O pads including at least one I/O pad in the two adjacent inner rows of I/O pads. The method includes forming an encapsulating layer (for example, elements 19, 119) overlying portions of the leadframe, the electronic device and the connective structures. The method includes removing the connective portion (for example, 32, 132) to isolate the at least two adjacent inner rows of I/O pads (for example, elements 17, 117).

Those skilled in the art will also appreciate that according to one more embodiment, wherein the step of forming the encapsulating layer (for example, elements 19, 119) includes forming the encapsulating layer within the gap.

Those skilled in the art will also appreciate that according to a further embodiment, the step of providing the leadframe (for example, elements 30, 50) includes providing the leadframe having a half-etched connective portion (for example, elements 32, 132).

Those skilled in the art will also appreciate that according to a still further embodiment, the step of attaching the first surface of the electronic device to the at least two adjacent inner rows of I/O pads includes attaching the first surface to one I/O pad (for example, element 175) with a conductive material and attaching the first surface to another I/O pad (for example, element 17) with a non-conductive material.

In view of all the above, it is evident that a novel structure and method is disclosed. Included, among other features, is an electronic device attached to an adjacent pair of inner rows of I/O pads. Connective structures electrically connect the electronic device to multiple rows of I/O pads. The adjacent pair of inner rows of I/O pads are configured to both support the electronic device and to receive the connective structures. This configuration eliminates the need for a flag or die attach portion. Among other things, this allows for multiple rows of I/O pads in a smaller foot-print package.

Although the subject matter of the invention has been described and illustrated with reference to specific embodiments thereof, it is not intended that the invention be limited to these illustrative embodiments. Those skilled in the art will recognize that modifications and variations can be made without departing from the scope of the invention. Therefore, it is intended that this invention encompass all such variations and modifications as fall within the scope of the appended claims.

I claim:

1. An electronic device structure comprising:
a leadframe having a pair of adjacent inner rows of I/O pads and at least one outer row of I/O pads, wherein the pair of adjacent inner rows of I/O pads are physically isolated from each other and each have an interior facing sidewall surface opposing each other;
an electronic device having first and second opposing major surfaces, wherein the second major surface is attached to at least two opposing I/O pads in the pair of adjacent inner rows of I/O pads;
connective structures coupling the first major surface to at least a portion of I/O pads in the pair of adjacent inner rows of I/O pads and the at least one outer row of I/O pads; and
an encapsulating layer covering at least portions of the leadframe, the electronic device and the connective structures, wherein the encapsulating layer is absent from a portion of the interior facing sidewall surface of each of the adjacent inner rows of I/O pads, wherein:
one I/O pad within the pair of adjacent inner rows of I/O pads is attached to the second major surface with a conductive material, and
a second I/O pad within the pair of adjacent inner rows of I/O pads is attached to the second major surface with a non-conductive material.

2. The structure of claim 1, wherein the electronic device structure is configured as a quad-flat pack no-lead (QFN) package.

3. The structure of claim 1, wherein the leadframe has at least two outer rows of I/O pads.

4. The structure of claim 1, wherein the leadframe is absent a flag portion adjacent a central portion of the electronic device.

5. The structure of claim 1 further comprising a slot between the pair of adjacent inner rows of I/O pads underlying the electronic device.

6. The structure of claim 1, wherein the second major surface is attached with a non-conductive adhesive.

7. The structure of claim 1, wherein the connective structures comprise wire bonds.

* * * * *